United States Patent
Maekawa et al.

(10) Patent No.: US 7,688,623 B2
(45) Date of Patent: Mar. 30, 2010

(54) MAGNETIC MEMORY CELL AND MAGNETIC MEMORY DEVICE

(75) Inventors: Sadamichi Maekawa, Sendai (JP); Saburo Takahashi, Sendai (JP); Hiroshi Imamura, Sendai (JP); Masahiko Ichimura, Kokubunji (JP); Hiromasa Takahashi, Hachioji (JP)

(73) Assignees: Hitachi, Ltd., Tokyo (JP); Tohoku University, Miyagi (JP)

( * ) Notice: Subject to any disclaimer, the term of this patent is extended or adjusted under 35 U.S.C. 154(b) by 250 days.

(21) Appl. No.: 11/970,550

(22) Filed: Jan. 8, 2008

(65) Prior Publication Data

US 2008/0175044 A1 Jul. 24, 2008

(30) Foreign Application Priority Data

Jan. 10, 2007 (JP) .............................. 2007-002577

(51) Int. Cl.
*G11C 11/14* (2006.01)
(52) U.S. Cl. ...................... 365/171; 365/173; 365/158; 365/97
(58) Field of Classification Search ................. 365/171, 365/173, 158, 189.011; 257/E21.665, 421

See application file for complete search history.

(56) References Cited

U.S. PATENT DOCUMENTS 7,372,727 B2 * 5/2008 Nakamura et al. .......... 365/171

FOREIGN PATENT DOCUMENTS

JP 2006-156477 6/2006

OTHER PUBLICATIONS

T. Kimura et al., Switching Magnetization of a Nanoscale Ferromagnetic Particle Using Nonlocal Spin Injection, Physical Review Letters, Jan. 27, 2006, The American Physical Society.

* cited by examiner

*Primary Examiner*—David Lam
(74) *Attorney, Agent, or Firm*—Antonelli, Terry, Stout & Kraus, LLP.

(57) ABSTRACT

The present invention aims to reduce heat fluctuations of a memory cell and thereby provide a stable writing operation when a magnetization reversal process not involving a reversal magnetic field is used for writing into the memory cell. The magnetic memory cell has a structure where first and second magnetization pinned terminals are connected, with a space therebetween, to one surface of a non-magnetic region, and a magnetization free terminal is connected to the other surface. Magnetization directions of the first and second magnetization pinned terminals are anti-parallel to each other. Writing is performed by controlling a polarity of a current flowing between the first and second magnetization pinned terminals through the non-magnetic region and thus reversing magnetization of the magnetization free terminal. Reading is performed by detecting a magnetic resistance attributable to a change in relative magnetization direction between the first magnetization pinned terminal and the magnetization free terminal.

18 Claims, 8 Drawing Sheets

US 7,688,623 B2

MAGNETIC MEMORY CELL AND MAGNETIC MEMORY DEVICE

CLAIM OF PRIORITY

The present application claims priority from Japanese application JP 2007-002577 filed on Jan. 10, 2007, the content of which is hereby incorporated by reference into this application.

BACKGROUND OF THE INVENTION

1. Field of the Invention

The present invention relates to a magnetic memory cell in which information writing and information reading are performed by the use of a magnetoresistance effect and also relates to a device using the same.

2. Description of the Related Art

The magnetoresistance effect is a phenomenon that an electric resistance is changed when a magnetic field is applied to a magnetic material or when a magnetization state of a magnetic material is changed. A magnetic head and a magnetic sensor have been known as a magnetoresistance effect device utilizing the magnetoresistance effect. Moreover, recently, a nonvolatile solid-state magnetic memory device (MRAM) and the like are being experimentally manufactured.

A mainstream configuration of an MRAM which is now experimentally manufactured has a matrix structure in which tunnel magnetoresistance (TMR) elements are arranged at intersection points between bit lines and word lines. A magnetization direction of each of the TMR elements is reversed by a synthetic magnetic field formed by a current flowing through each line. Thus, the writing of information is performed. In this case, the TMR element serves as a memory cell. In order to read information from the memory cell, cell selection by a MOS transistor is required due to the presence of a leak current from the memory cell. As to the MRAM having the above structure, there have been pointed out, due to the structure, a drawback such as a complex process technology as well as the following three drawbacks that make the MRAM unfit for having higher density and larger capacity. The first drawback is that effective reversal magnetic field conditions are narrowed by reduction in size of the memory cell. The second is that a reversal magnetic field is increased by reduction in thickness of the magnetic material, and therefore a line current and power consumption are increased. The third is that, having a MOS transistor, the MRAM has a possible integration level only as high as a DRAM.

In the meantime, there has recently been proposed a spin torque, which is a magnetization reversal process using no reversal magnetic field, and the occurrence of magnetization reversal by the spin torque has actually been confirmed. It has also been proposed that the spin torque be used for writing into a memory cell. However, the magnetization reversal by use of the spin torque currently has the following technical problem. The problem is specifically that a critical current density as high as approximately $10^8$ A/cm$^2$ is required to generate the spin torque that causes the magnetization reversal.

Meanwhile, spin torque magnetization reversal caused by a spin flow alone has been examined by use of a device structure called a non-local spin valve. However, it has only been confirmed that magnetization of a magnetization free layer is rotated to one direction from an anti-parallel state to a parallel state with respect to a magnetization pinned layer. Thus, writing into a memory cell with perfect control has not yet been realized; see Phys. Rev. Lett. 96, 037201-1-037201-4 (2006) (Non-patent Document 1). When only one direction of rotation was confirmed, the value of a critical current density in a non-magnetic portion that carries the spin flow became as high as approximately $2\times10^8$ A/cm$^2$.

Since the TMR element utilizes a high resistance of a tunnel barrier, such a high critical current density required for magnetization reversal leads to a concern over electrostatic breakdown of the tunnel barrier. In order to avoid the electrostatic breakdown, it has been proposed to separate a write current path from a read current path in a memory cell by making an element including three terminals in Japanese Patent Application Laid-Open Publication No. 2006-156477. However, since this three-terminal device structure includes three magnetic layers on a read current path, there arises a concern over a magnetic noise effect as the device is miniaturized.

SUMMARY OF THE INVENTION

It is an object of the present invention to provide a magnetic memory cell which reduces heat fluctuations of the memory cell and performs a stable writing operation when a magnetization reversal process not involving a reversal magnetic field for writing into the memory cell is adopted as well as in the case of spin torque magnetization reversal. The present invention also aims to provide a device using the magnetic memory cells.

In order to achieve the foregoing objects, a magnetic memory cell according to the present invention includes: first and second magnetization pinned terminals connected, with a space therebetween, to one surface of a non-magnetic region; and a magnetization free terminal connected to the other surface of the non-magnetic region. In the magnetic memory cell, magnetization directions of the first and second magnetization pinned terminals are anti-parallel to each other. Moreover, writing is performed by controlling a polarity of a current flowing between the first and second magnetization pinned terminals through the non-magnetic region, and thus reversing magnetization of the magnetization free terminal. Furthermore, reading is performed by detecting a magnetic resistance attributable to a change in the relative magnetization direction between the first magnetization pinned terminal and the magnetization free terminal.

In the above configuration, reading from the magnetic memory cell, in other words, reading of the magnetization direction of the magnetization free terminal can be performed through a current path different from that in writing into the memory cell, in other words, at the time of magnetization reversal. Since only a current having a direct current density of not more than $10^4$ A/cm$^2$ flows through the magnetization free terminal, heat fluctuations of the magnetization free terminal due to Joule heat can be suppressed. Moreover, for the reason described above, a relatively large current density can be used to perform writing; and this allows a writing operation to be carried out stably.

According to the present invention, it is possible to realize a magnetic memory cell which enables stable writing with a low current density required for reading and low magnetic fluctuations of the memory cell.

DETAILED DESCRIPTION OF THE PREFERRED EMBODIMENTS

With reference to the drawings, an embodiment of the present invention will be described below.

Application 1 to Solid State Memory Cell

Figure 1:
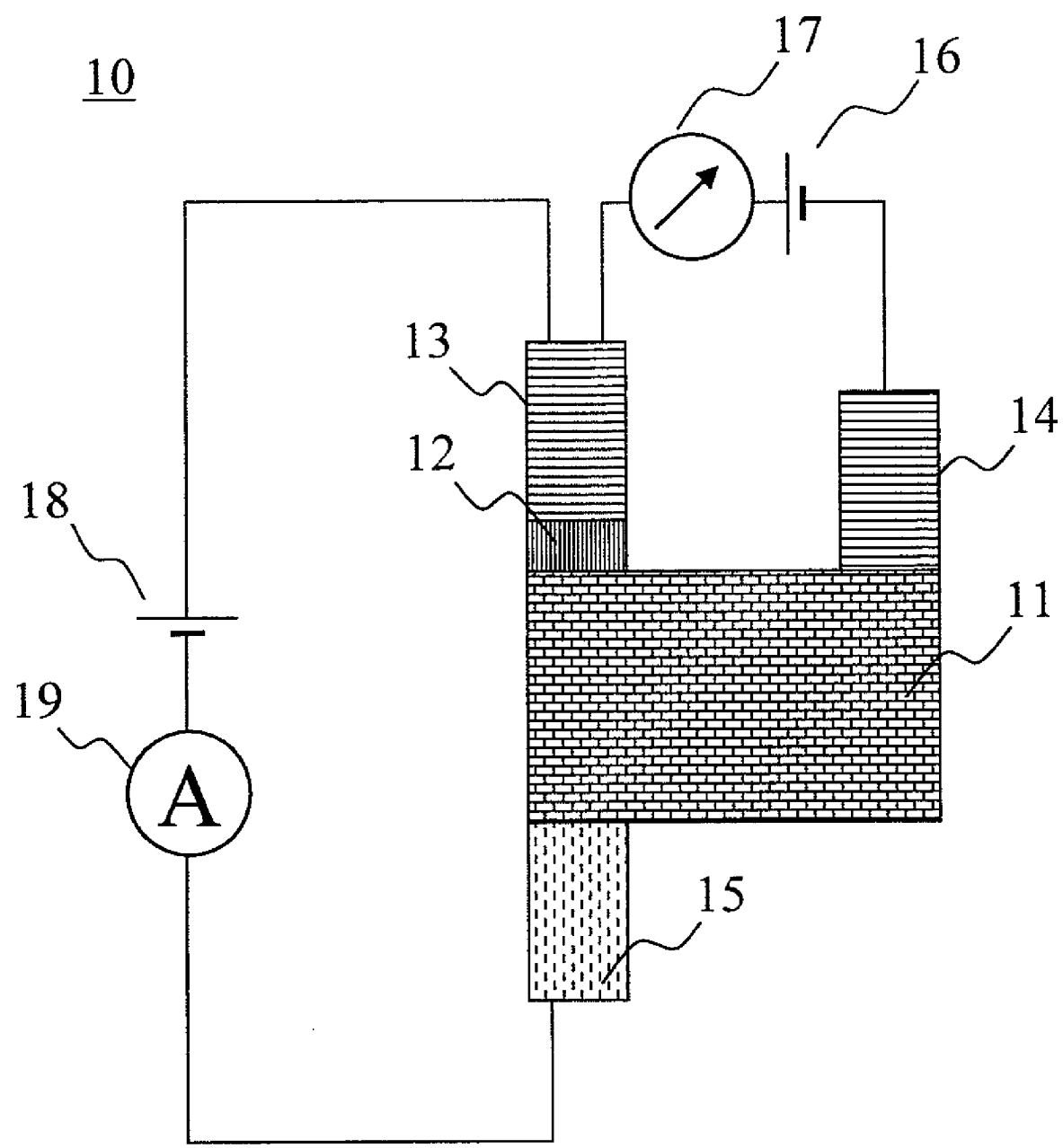
FIG. 1 is a view showing an example of a planar structure of a magnetic memory cell according to the present invention.

FIG. 1 is a view showing a planar structure of a magnetic memory cell 10 according to the present invention. An aluminum (Al) island (non-magnetic region) 11 having a width of 400 nm and a length of 400 nm is prepared by use of a standard electron-beam lithography technology, and a portion 12 of the Al island 11 is oxidized by use of a lift-off technique. Thereafter, a first magnetization pinned terminal 13 made of a Co thin wire having a width of 50 nm is connected to the oxidized portion 12 of the Al island so as to form a tunnel junction. Meanwhile, a second magnetization pinned terminal 14 made of a Co thin wire having a width of 100 nm and a magnetization free terminal 15 made of a permalloy (Py) thin wire having a width of 50 nm are connected to the Al island 11. In this case, the Al island 11, the magnetization pinned terminals 13 and 14, and the magnetization free terminal 15 all have a thickness of 40 nm. After a sufficiently large external magnetic field is applied to align magnetization directions of the magnetization pinned terminals 13 and 14 and the magnetization free terminal 15 in one direction, an external magnetic field having an opposite direction to the above magnetic field is swept to reverse only the magnetization direction of the second magnetization pinned terminal 14. The first magnetization pinned terminal 13 and the second magnetization pinned terminal 14 are provided with a space therebetween on one surface of the non-magnetic region 11. The magnetization free terminal 15 is provided on a different surface of the non-magnetic region 11 from the surface on which the magnetization pinned terminals 13 and 14 are provided. FIG. 1 shows the example where the magnetization free terminal 15 is provided at a position facing the first magnetization pinned terminal 13 across the non-magnetic region. However, the magnetization free terminal 15 does not always have to face the first magnetization pinned terminal 13.

Figure 2:
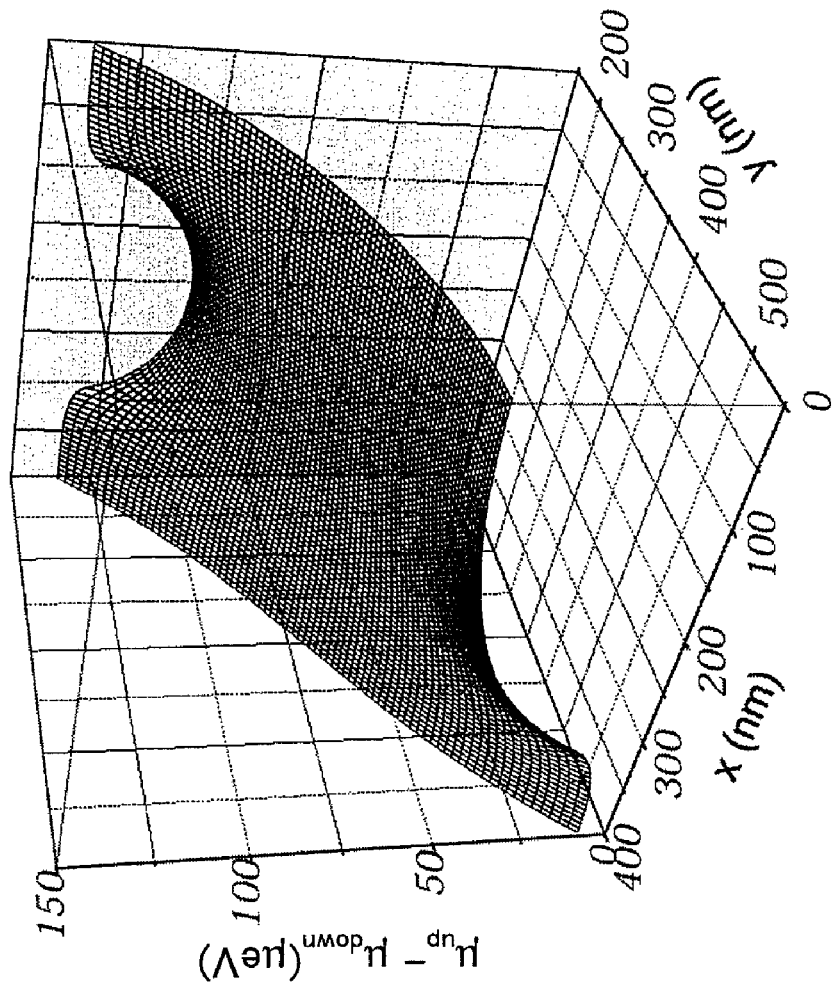
FIG. 2 is a view showing a simulation result of spin accumulation in a magnetic memory cell according to the present invention.
Figure 2:
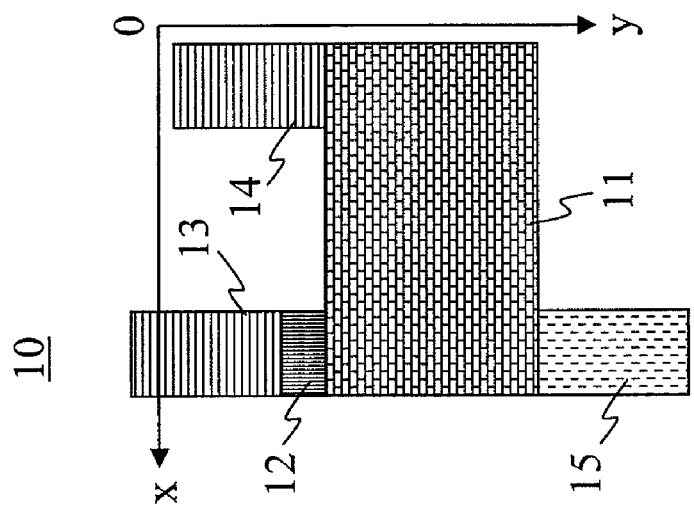

FIG. 2 shows a simulation result obtained in the case where a current of 100 μA is applied in the direction from the first magnetization pinned terminal 13 to the second magnetization pinned terminal 14 in the above magnetization state. It should be noted that each of the magnetization terminals 13, 14, and 15 is set to have a width of 100 nm for simplicity. FIG. 2 shows a simulation result representing a spatial distribution of spin accumulation in the Al island 11 when an x-y coordinate system is introduced as shown in the left drawing in FIG. 2. ΔECP represents a difference in electrochemical potential between an upward spin and a downward spin. Specifically, this slope is proportional to the size of a spin flow flowing into and out of each of the magnetization terminals. This simulation is carried out at an absolute zero of temperature (T=0 K), and temperature dependence of the system is taken into consideration according to spin diffusion lengths of magnetic and non-magnetic materials. To be more specific, spin diffusion lengths of Co, Py and Al are set to be 50 nm, 5 nm and 600 nm, respectively, which have been estimated at low temperature.

Figure 3A:
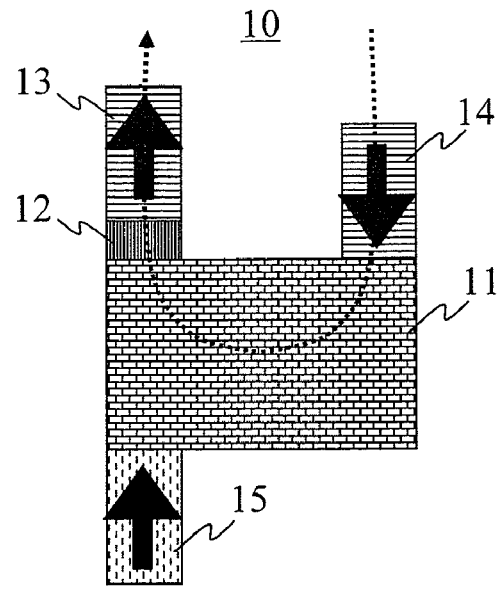
FIGS. 3A to 3C are schematic figures of spin accumulation in a magnetic memory cell according to the present invention.
Figure 3B:
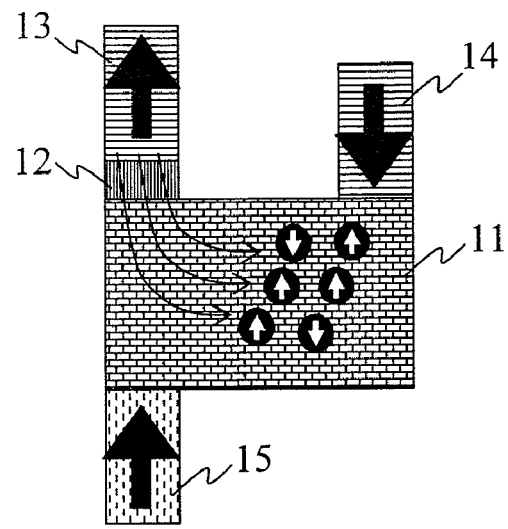
Figure 3C:
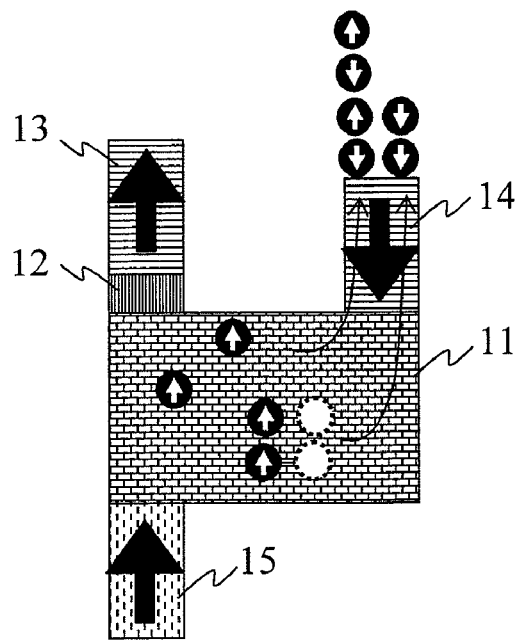

Here, for intuitive understanding of spin accumulation, FIGS. 3A, 3B, and 3C show how spins are accumulated. In FIG. 3A, a dotted arrow indicates the direction of a current flow, and three thick arrows indicate the magnetization directions of the magnetization terminals. In FIGS. 3A, 3B, and 3C, the magnetization directions are indicated by the upward and downward arrows. Since only a parallel or anti-parallel relationship among the magnetization directions is important, a magnetization direction may be left and right, or frontward and backward with respect to the paper surface in addition to upward and downward as shown in FIGS. 3A, 3B, and 3C. FIG. 3B shows electrons flowing into the non-magnetic region 11 from the magnetization terminal 13 in a snapshot taken at certain time intervals. In this case, it is assumed here that six electrons have been injected. For simplicity, suppose that the spin polarizability of the magnetization terminal 13 is 66.6% (=2/3), and it is determined that four out of the six electrons have an upward spin and the remaining two have a downward spin. FIG. 3C shows electrons flowing into the magnetization terminal 14 from the non-magnetic region 11 in a snapshot taken at the same time intervals as in FIG. 3B. According to the law of conservation of charge, the injected six electrons must flow out. Moreover, if suppose that the spin polarizability of the magnetization terminal 14 is also 66.6%, for simplicity, it is determined that two out of the six electrons to flow out have to have a upward spin and the remaining four have a downward spin. Therefore, two upward spins remain.

Downward spins have to be carefully examined. There are only two downward spins in FIG. 3B. Since the requirement is that the number of downward spins to flow out is four, two downward spins are taken out of the electrons in the non-magnetic material itself of the non-magnetic region 11. These downward spins to be taken out are indicated by dotted circles in FIG. 3C. As a result, disruption of the balance between upward spins and downward spins in the non-magnetic material causes two upward spins to appear. These upward spins to appear are indicated by upward spins connected with the dotted circles described above. It should be noted that these upward spins have a positive charge. As a result, the total charge becomes zero, and four upward spins are to be accumulated in the non-magnetic region 11. Being spins in a nonequilibrium steady state, the spins accumulated in the non-magnetic region 11 are diffused as a spin flow into the magnetization terminal 15. However, since there is no current flowing through the magnetization terminal 15, the charges are required to be conserved.

Figure 4:
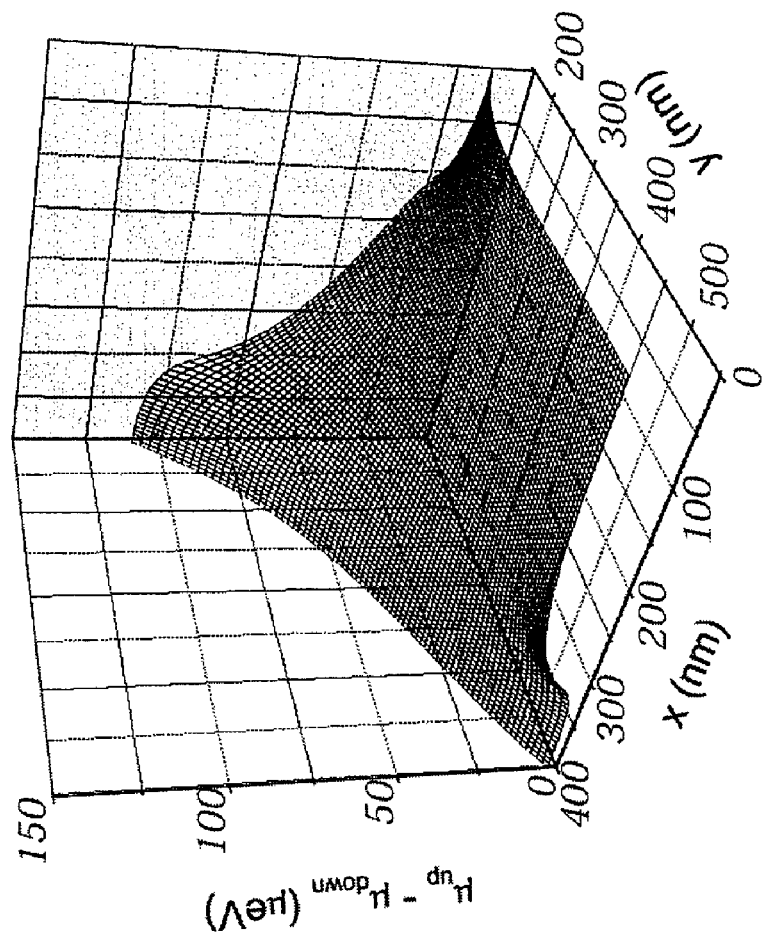
FIG. 4 is a view showing a simulation result of spin accumulation in a magnetic memory cell where the pinned terminal is replaced by a non-magnetic insulator.
Figure 4:
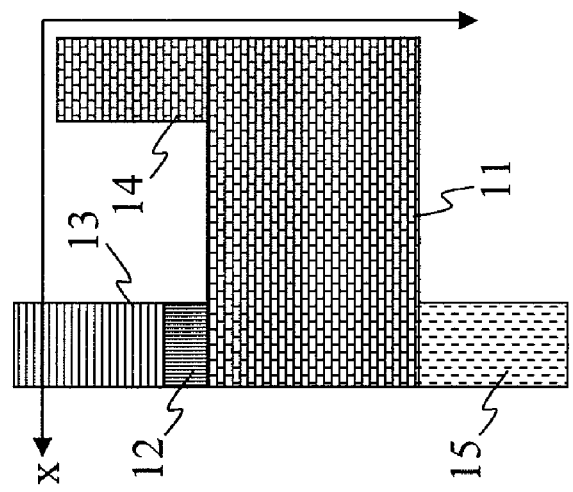

For comparison, FIG. 4 shows a simulation result obtained in the case where only one of current injection terminals is made of a magnetic material and the other one is made of a non-magnetic material, as in the case of Non-patent Document 1. In relation to FIG. 2, FIG. 4 shows the case where the second magnetization pinned terminal 14 is made of a non-magnetic material. As is clear from the comparison between FIGS. 2 and 4, not only is the spin accumulation larger in FIG. 2 but the slope in the vicinity of the magnetization free terminal 15 is also steeper in FIG. 2. Therefore, in the magnetic memory cell of the present invention, compared with the configuration corresponding to the device disclosed in Non-patent Document 1, the spin flow can be more efficiently injected into the magnetization free terminal 15. Thus, the magnetization of the magnetization free terminal 15 can be reversed with a smaller current value. Moreover, in the case of reversal of current polarity, the symbols in the spin accumulation are merely reversed since the magnetization directions of the two magnetization pinned terminals are opposite to each other. As compared with the configuration corresponding to the device disclosed in Non-patent Document 1, the device structure is symmetrical in terms of reversal of current polarity. Thus, the magnetization direction of the magnetization free terminal 15 can be easily set parallel or anti-parallel to the magnetization direction of the first magnetization pinned terminal 13. Hence, writing into the memory cell with perfect control can be easily realized.

Electrodes which come into contact with the first and second magnetization pinned terminals 13 and 14 in the magnetic memory cell 10 are provided outside the memory cell, and an electrode is further provided on the magnetization free terminal 15. First, a sense current of 0.1 µA is supplied in the direction from the first magnetization pinned terminal 13 to the magnetization free terminal 15. A resistance was measured at this point. Next, a current of 10 µA is supplied with a pulse width of 1 ns in the direction from the first magnetization pinned terminal 13 to the second magnetization pinned terminal 14. Subsequently, a sense current of 0.1 µA is supplied in the direction from the first magnetization pinned terminal 13 to the magnetization free terminal 15. A resistance was measured at this point as well, and it was found that the resistance was increased by approximately 100 Ω. This change in resistance is approximately equal to the change in resistance in the case where a sufficiently large external magnetic field is applied to align the magnetization directions of all the magnetization terminals in one direction, and then an external magnetic field having an opposite direction thereto is swept to reverse the magnetization of the magnetization free terminal 15, as in the case described above. Specifically, supply of the current of 10 µA in the direction from the first magnetization pinned terminal 13 to the second magnetization pinned terminal 14 induces reversal of magnetization of the magnetization free terminal 15. Therefore, the magnetization of the magnetization free terminal 15 is considered to be anti-parallel to that of the first magnetization pinned terminal 13.

Next, a current of 10 µA is supplied with a pulse width of 1 ns in the direction from the second magnetization pinned terminal 14 to the first magnetization pinned terminal 13. In other words, a current having an opposite polarity to that of the current-induced magnetization reversal described above is supplied. Before and after this current supply, the resistance between the first magnetization pinned terminal 13 and the magnetization free terminal 15 was measured by following the same procedures as described above. It was found that the resistance was reduced by approximately 100 Ω. Specifically, the magnetization of the magnetization free terminal 15 is considered to be in an initial state of being parallel to the magnetization of the first magnetization pinned terminal 13. The above change in resistance is equivalent to approximately 100% when expressed in a magnetoresistance ratio.

The device size is not limited to the value described above. Since the spin diffusion length of the Al island, which is a spin accumulation region, is 600 nm, the spin flow can be relatively efficiently transported as long as the device size is smaller than that value. Moreover, even when a different material is used for the spin accumulation region, the same effect can be achieved as long as the device size is set smaller than a spin diffusion length of that material. Having the device size larger than its spin diffusion length, the magnetization terminals can perform more effective injection and suction of the spins. In this case, Co is used for the first and second magnetization pinned terminals, and a Co-base alloy, such as CoFe and CoFeB, also has the same spin diffusion length. When an MgO insulator is used as a material of a tunnel barrier, CoFe and CoFeB are preferable from the viewpoint of formation of a matched interface.

In terms of current density, the current in the magnetization reversal described above is equivalent to $5 \times 10^5$ A/cm$^2$ in the smaller Co terminal. This value is larger by about one digit than an ideal value if suppose the cells are integrated to form a memory. This is because, in the case where the cells operate as a memory, a current density of approximately $10^3$ A/cm$^2$ is required to drive a decoder for specifying an address and a MOS-FET for selecting a cell. If the magnetization reversal can be performed at a value larger by one digit than the above value, the magnetization is to be reversed at low power consumption without accidentally causing the magnetization reversal by a current value for specifying the address. Moreover, a current value in measurement of the magnetic resistance described above is smaller by two digits than that in the magnetization reversal. However, if suppose the cells are accumulated to form a memory as well, a distinct difference of one digit or above is required between the two current values.

The current in the magnetization reversal is not limited to the pulse width of 1 ns described above. Even if the shortest pulse width is set to 1 ns due to constraints on an experimental apparatus, the same change in resistance can also be confirmed with the pulse width of 100 ns. It should be noted, however, that prolonged current supply leads to a concern over magnetization instability due to an increase in temperature.

Application 2 to Solid State Memory Cell

Figure 5:
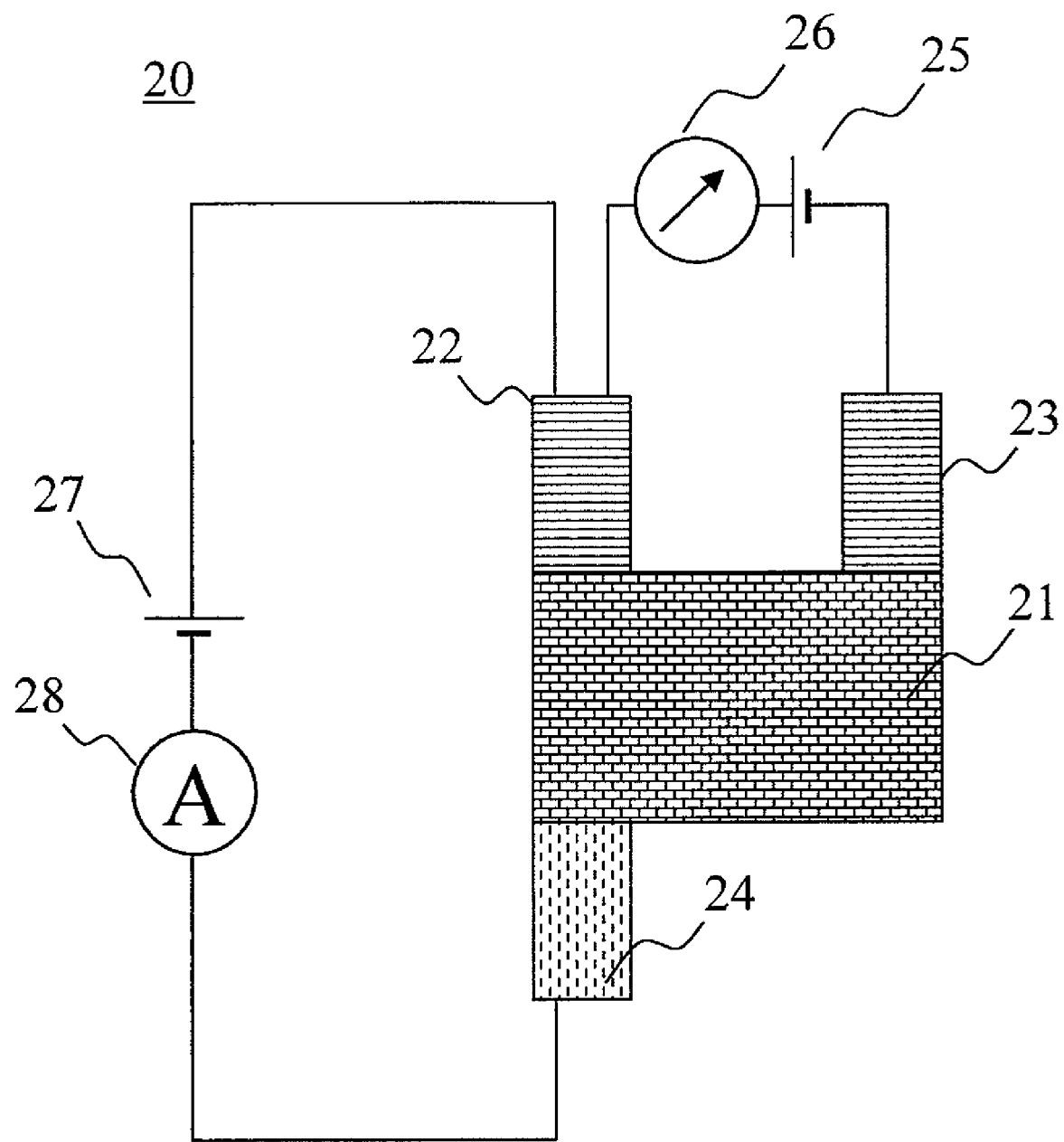
FIG. 5 is a view showing another example of a planar structure of a magnetic memory cell according to the present invention.

FIG. 5 is a view showing another example of a planar structure of a magnetic memory cell 20 according to the present invention. An Al island (non-magnetic region) 21 having a width of 400 nm and a length of 400 nm is prepared by use of an ordinary electron-beam lithography technology. Thereafter, a first magnetization pinned terminal 22 made of a Co thin wire having a width of 50 nm, a second magnetization pinned terminal 23 made of a Co thin wire having a width of 100 nm, and a magnetization free terminal 24 made of a permalloy (Py) thin wire having a width of 50 nm are connected to the Al island 21. The first magnetization pinned terminal 22 and the second magnetization pinned terminal 23 are provided with a space therebetween on one surface of the non-magnetic region 21. Moreover, the magnetization free terminal 24 is provided on a different surface of the non-magnetic region 21 from the surface on which the magnetization pinned terminals 22 and 23 are provided. FIG. 5 shows the example where the magnetization free terminal 24 is provided at a position facing the first magnetization pinned terminal 22 across the non-magnetic region 21. However, it is not necessarily meant that having the arrangement shown in FIG. 5 is essential.

An operation of the memory cell is the same as that of the magnetic memory cell 10 shown in FIG. 1. First, a sense current of 0.1 µA is supplied in the direction from the first magnetization pinned terminal 22 to the magnetization free terminal 24. A resistance was measured at this point. Next, a current of 20 µA is supplied with a pulse width of 1 ns in the direction from the first magnetization pinned terminal 22 to the second magnetization pinned terminal 23. Subsequently, a sense current of 0.1 µA is supplied in the direction from the first magnetization pinned terminal 22 to the magnetization free terminal 24, and a resistance was measured at this point as well. As a result, it was found that the resistance was increased by approximately 1Ω. This change in resistance is approximately equal to a change in resistance in the case where an external magnetic field is swept to reverse magnetization of the magnetization free terminal 24, as in the case of the magnetic memory cell 10 shown in FIG. 1. Then, a current of 20 μA is supplied with a pulse width of 1 ns in the direction from the second magnetization pinned terminal 23 to the first magnetization pinned terminal 22. The resistances between the first magnetization pinned terminal 22 and the magnetization free terminal 24 before and after the current supply were measured, and it was found that the resistance was reduced by approximately 1 Ω.

Application 1 to Solid State Memory

Figure 6:
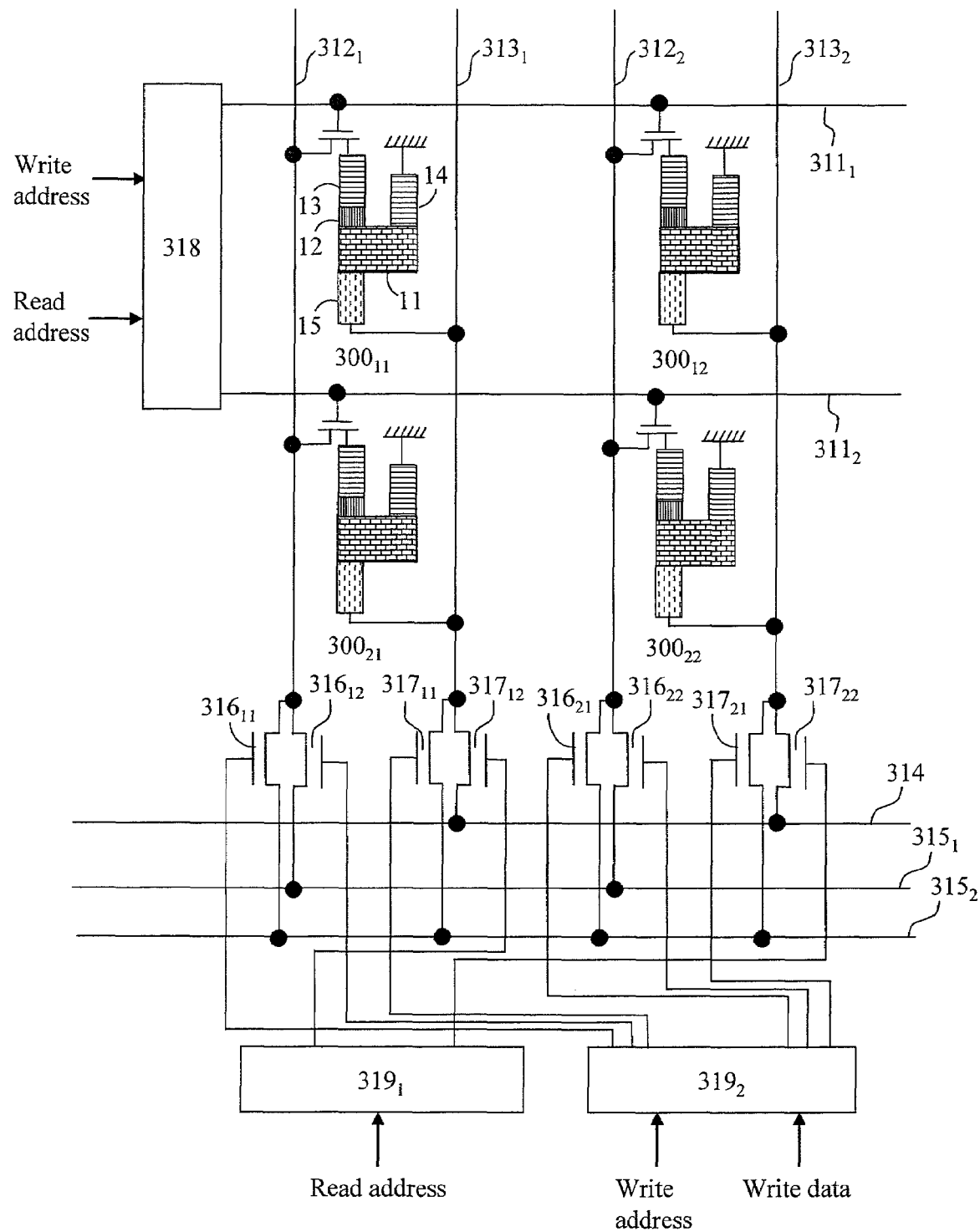
FIG. 6 is a view showing an example of a solid state memory according to the present invention.

Next, description will be given of an example of a solid state memory using the magnetic memory cell shown in FIG. 1. FIG. 6 shows a solid state memory having two rows and two columns as an example that the magnetic memory cells 10 shown in FIG. 1 are arranged in an X-Y matrix pattern. In FIG. 6, the magnetic memory cells $300_{11}$, $300_{12}$, $300_{21}$ and $300_{22}$ shown in FIG. 1 are arranged at intersections where bit lines $311_1$ and $311_2$ cross with word lines $312_1$, $312_2$, $313_1$ and $313_2$, respectively. Two word lines are provided for each memory cell. Reference numeral 318 denotes a decoder for the bit lines, and reference numerals $319_1$ and $319_2$ denote decoders for the word lines. In response to specification of a write or read address, the decoders 318 and 319 select one of the bit lines and one of the word lines, respectively. Thereafter, a gate is opened and a current is supplied to each of the magnetic memory cells 300 from a source. Incidentally, the word lines $313_1$ and $313_2$ are selectively connected to a data line 314 by opening and closing of the gates of MOS-FETs $317_{12}$ and $317_{22}$. Reference numerals $315_1$ and $315_2$ denote negatively-biased and positively-biased power supply lines, respectively.

First of all, description will be given of an operation by taking, as an example, writing into the magnetic memory cell $300_{11}$. First, current is applied to the bit line $311_1$ by the decoder 318 which specifies a write address to open the gate near the magnetization terminal 13 in the magnetic memory cell $300_{11}$. Since the magnetization terminal 14 is grounded, the word line $312_1$ is to be connected to the positively-biased power supply line $315_2$ or the negatively-biased power supply line $315_1$ by opening any of gates of MOS-FETs $316_{11}$ and $316_{12}$ by the decoder $319_2$ which specifies a write address. As described above, being reversed or retained by a polarity of a supply current depending on the initial state, the magnetization direction of the magnetization free terminal 15 is uniquely determined. When the positively-biased power supply line $315_2$ is selected by opening the gate of the MOS-FET $316_{11}$, it is necessary to maintain the potential of the other word line $313_1$ equivalent to that of the word line $312_1$ by opening a gate of a MOS-FET $317_{11}$ at the same time in order to prevent the current from flowing into the magnetization free terminal 15 while allowing a spin flow to flow through the magnetization free terminal 15. When the negatively-biased power supply line $315_1$ is selected, it is not necessary to connect between the power supply line and the word line $313_1$, since there is no current flow flowing into the magnetization free terminal 15.

Next, description will be given of an operation by taking, as an example, reading from the magnetic memory cell $300_{11}$. First, current is applied to the bit line $311_1$ by the decoder 318 which specifies a read address to open the gate near the magnetization terminal 13 in the magnetic memory cell $300_{11}$. By opening the gate of the MOS-FET $317_{12}$ by the decoder $319_1$ which specifies a read address, a resistance connected to the data line 314 is read.

Figure 7:
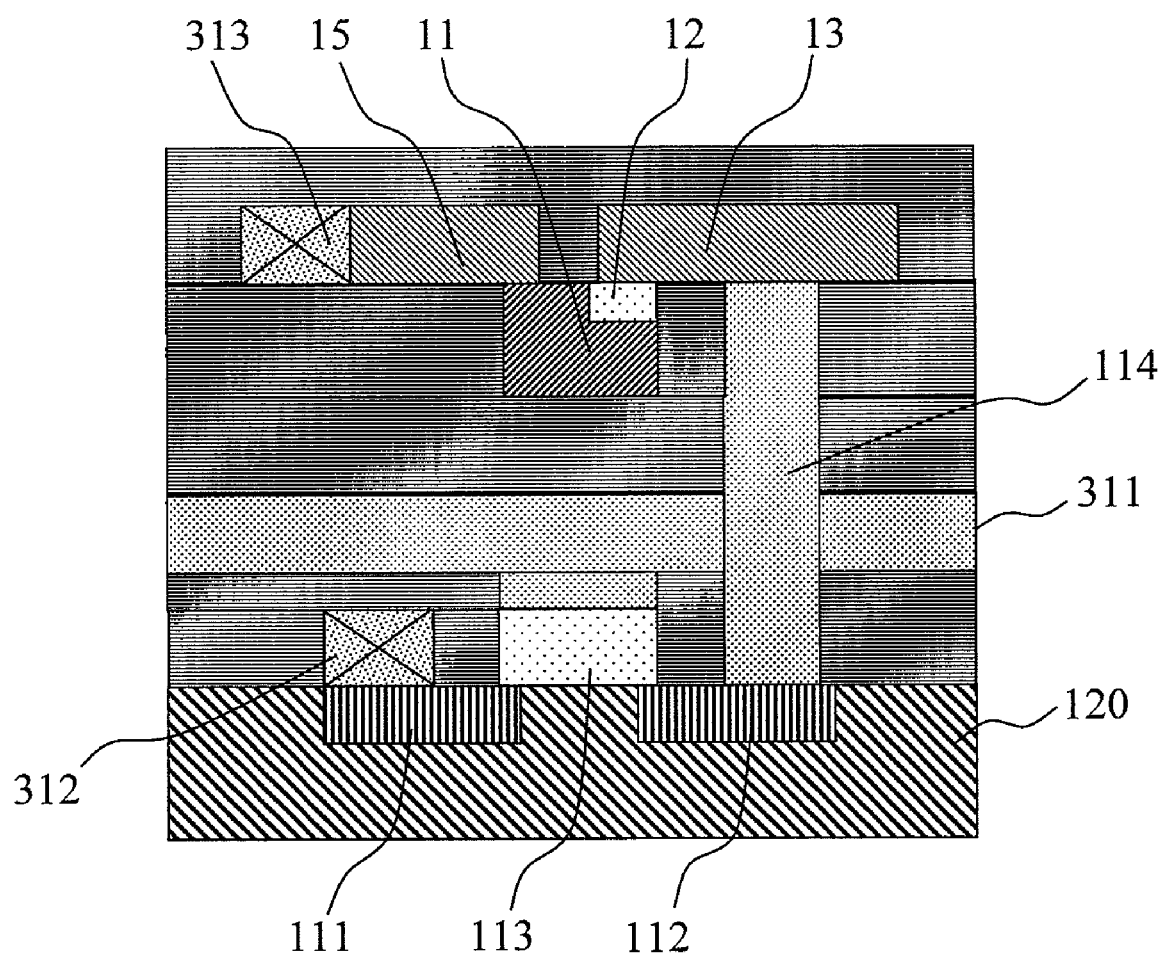
FIG. 7 is a view showing a single solid state memory cell according to the present invention being mounted on a silicon substrate.

FIG. 7 is a schematic view focusing on a single memory cell 110 to show an example where a solid state memory using the magnetic memory cells shown in FIG. 1 described above is mounted on a silicon substrate. On a silicon substrate 120, a MOS-FET is formed. Reference numerals 111 and 112 in FIG. 7 denote a source and a drain of the MOS-FET, respectively. A first word line 312, an oxide layer 113 of the MOS-FET, and a wiring 114 to the drain are formed. Reference numeral 311 in FIG. 7 denotes a bit line. A non-magnetic region 11, an oxide layer 12, a magnetization pinned terminal 13, a magnetization free terminal 15, and a second word line 313 are formed. All of those described above are formed by use of a lithography technology commonly used in the field of semiconductor. The bit line 311 and the first and second word lines 312 and 313 are formed in an X-Y matrix pattern. Although FIG. 7 shows only a single memory cell, a plurality of such memory cells are arranged in the X-Y matrix pattern on the silicon substrate 120. In this example, Cu is used as a material of the bit line and the word lines.

Application 2 to Solid State Memory

Figure 8:
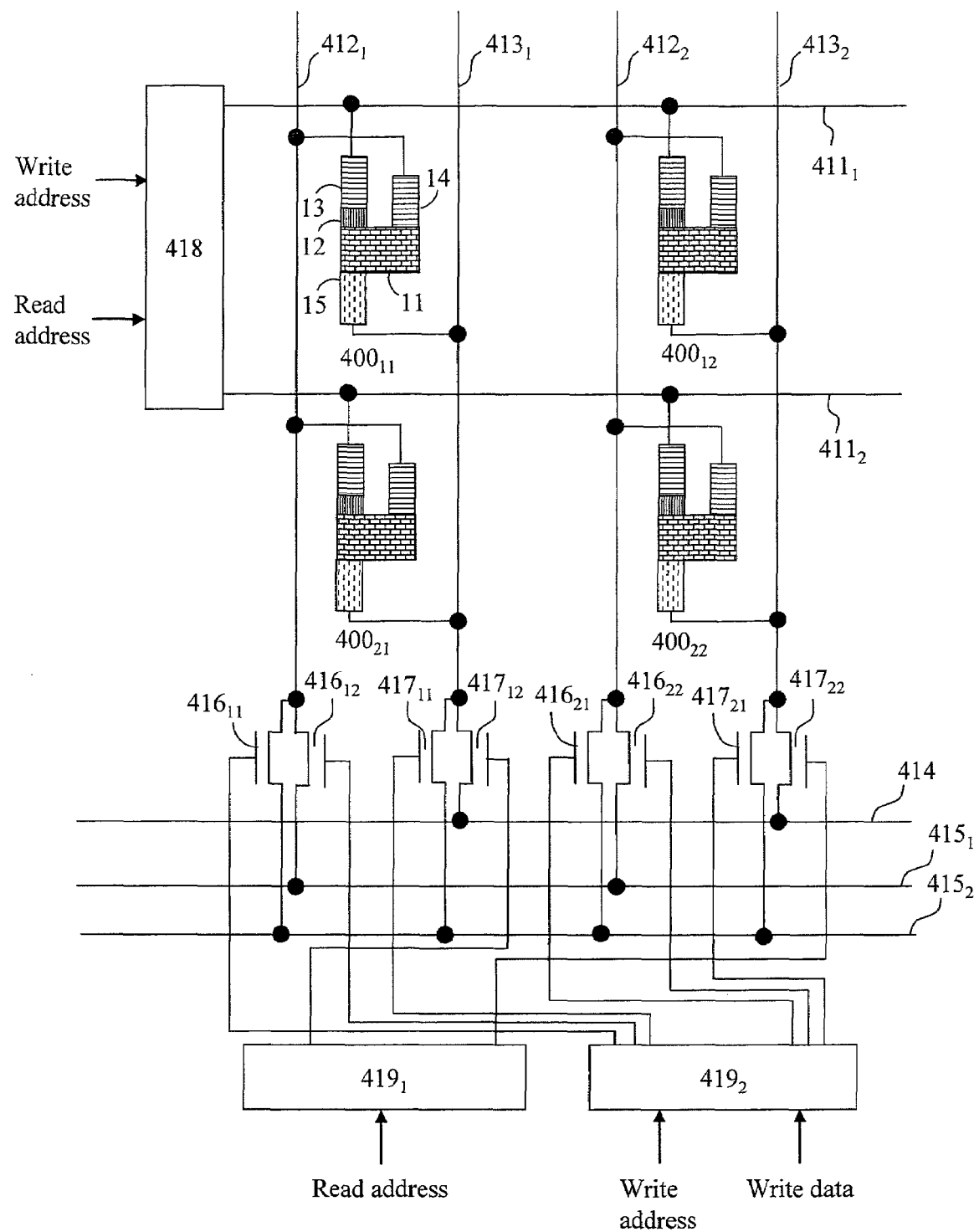
FIG. 8 is a view showing an example of a solid state memory according to the present invention.

FIG. 8 shows a solid state memory having 2 rows and two columns as an example that the magnetic memory cells 10 shown in FIG. 1 are arranged in an X-Y matrix pattern. The solid state memory shown in FIG. 8 is different from that shown in FIG. 6 in a point that memory cell selection is possible without using a MOS-FET, since a magnetoresistance ratio of the magnetic memory cell 10 reaches a value as large as approximately 100%.

In FIG. 8, as in the case of the solid state memory shown in FIG. 6, the magnetic memory cells $400_{11}$, $400_{12}$, $400_{21}$ and $400_{22}$ shown in FIG. 1 are arranged at intersections where bit lines $411_1$ and $411_2$ cross with word lines $412_1$, $412_2$, $413_1$ and $413_2$. As in the case of the solid state memory shown in FIG. 6, two word lines are provided for each memory cell. Reference numeral 418 denotes a decoder for the bit lines, and reference numerals $419_1$ and $419_2$ denote decoders for the word lines. In response to specification of a read or write address, the decoders 418, $419_1$ and $419_2$ select one of the bit lines and one of the word lines, respectively, to supply a current to each of the magnetic memory cells 400. The word lines $413_1$ and $413_2$ are selectively connected to a data line 414 by opening and closing gates of MOS-FETs $417_{12}$ and $417_{22}$. Reference numerals $415_1$ and $415_2$ denote negatively-biased and positively-biased power supply lines, respectively. Incidentally, unlike the solid state memory shown in FIG. 6, having no MOS-FET for cell selection, the solid state memory shown in FIG. 8 has the bit lines 411 connected to the two positive and negative power supply lines. Specifically, although not shown in FIG. 8, the same arrangement as that of MOS-FETs $416_{11}$ and $416_{12}$ and the power supply lines $415_1$ and $415_2$ provided in the word lines 412 is provided in the bit lines 411.

For example, when a current is supplied between the bit line $411_1$ and the word line $412_1$ selectively connected to the power supply lines $415_1$ and $415_2$, the magnetization direction of the magnetization free terminal in FIG. 1 is reversed or retained by a polarity of the supply current. Specifically, writing is performed by changing the magnetization direction of the magnetization free terminal in FIG. 1. In writing, when the bit line $411_1$ is positively biased and the word line $412_1$ is negatively biased or when both of the lines have their polarities reversed, it is necessary to apply a positive bias to the other word line $413_1$ in order to prevent the current from flowing into the magnetization free terminal 15 while allowing only a spin flow to flow through the magnetization free terminal 15. As described above, in writing, the word line $413_1$ is always positively biased. Meanwhile, reading is performed by applying a voltage between the bit line $411_1$ and the word line $413_1$ selectively connected to the data line 414 and by reading a resistance depending on a relative magnetization direction between the magnetization pinned terminal 13 and the magnetization free terminal 15 in FIG. 1.

What is claimed is:

1. A magnetic memory cell comprising:
a non-magnetic region;
first and second magnetization pinned terminals connected, with a space therebetween, to one surface of the non-magnetic region; and
a magnetization free terminal connected to a different surface of the non-magnetic region from the surface to which the first and second magnetization pinned terminals are connected,
wherein magnetization directions of the first and second magnetization pinned terminals are anti-parallel to each other, and
writing is performed by controlling a polarity of a current flowing between the first and second magnetization pinned terminals through the non-magnetic region and thus reversing magnetization of the magnetization free terminal.

2. The magnetic memory cell according to claim 1, wherein a magnetization direction of the magnetization free terminal is detected by applying a sense current between the first magnetization pinned terminal and the magnetization free terminal.

3. The magnetic memory cell according to claim 1, further comprising an insulating layer between the first magnetization pinned terminal and the non-magnetic region.

4. The magnetic memory cell according to claim 1, wherein a spin diffusion length of the magnetization free terminal is shorter than spin diffusion lengths of the first and second magnetization pinned terminals.

5. The magnetic memory cell according to claim 1, wherein the first and second magnetization pinned terminals are made of a ferromagnetic alloy which has a spin polarizability equal to or larger than that of the magnetization free terminal and has a spin diffusion length larger than 50 nm, and
the magnetization free terminal is made of a ferromagnetic alloy which has a spin diffusion length smaller than 50 nm.

6. The magnetic memory cell according to claim 1, wherein the first and second magnetization pinned terminals are made of Co or a Co-base alloy, and
the magnetization free terminal is made of a NiFe alloy.

7. The magnetic memory cell according to claim 1, wherein the non-magnetic region is made of Al.

8. The magnetic memory cell according to claim 1, further comprising:
a three-terminal structure in which a current path in magnetization reversal is different from a current path in magnetization detection.

9. The magnetic memory cell according to claim 2, wherein,
in any one of cases where a current is applied to the second magnetization pinned terminal from the first magnetization pinned terminal through the non-magnetic region, and where the current is applied in the opposite direction, the magnetization direction of the magnetization free terminal is reversed with a current density of not less than $10^4$ A/cm$^2$, and,
in a case where a current is applied to the magnetization free terminal from the first magnetization pinned terminal through the non-magnetic region, a change in magnetic resistance is detected with a current density of not more than $10^4$ A/cm$^2$.

10. A magnetic memory device comprising:
a plurality of magnetic memory cells;
a selection means for selecting one of the plurality of magnetic memory cells;
a write means for performing writing by reversing magnetization of the selected magnetic memory cell; and
a read means for reading the magnetization of the selected magnetic memory cell, wherein
each of the magnetic memory cells includes: a non-magnetic region; first and second magnetization pinned terminals connected, with a space therebetween, to one surface of the non-magnetic region; a magnetization free terminal connected to a different surface of the non-magnetic region from the surface to which the first and second magnetization pinned terminals are connected, and magnetization directions of the first and second magnetization pinned terminals are non-parallel to each other,
the write means performs writing by applying a current between the first and second magnetization pinned terminals through the non-magnetic region in the selected magnetic memory cell, and thus reversing magnetization of the magnetization free terminal with a polarity of the current, and
the read means reads the magnetization of the selected magnetic memory cell by applying a sense current between the first magnetization pinned terminal and the magnetization free terminal in the magnetic memory cell, and thus detecting a magnetic resistance attributable to the magnetization direction of the magnetization free terminal relative to the magnetization direction of the first magnetization pinned terminal.

11. The magnetic memory device according to claim 10, wherein
the second magnetization pinned terminal is grounded in the magnetic memory cell,
when writing is performed, the write means selectively applies any one of a positive bias voltage and a negative bias voltage to the first magnetization pinned terminal, and,
when the positive bias voltage is applied to the first magnetization pinned terminal, the write means applies the same positive bias voltage to the magnetization free terminal.

12. The magnetic memory device according to claim 10, wherein,
when the writing is performed, the write means selectively applies any one of a positive bias voltage and a negative bias voltage to the first magnetization pinned terminal, and
the write means further applies, to the second magnetization pinned terminal, a bias voltage having a polarity opposite to that of the bias voltage applied to the first magnetization pinned terminal, as well as a positive bias voltage to the magnetization free terminal.

13. The magnetic memory device according to claim 10, further comprising an insulating layer between the first magnetization pinned terminal and the non-magnetic region.

14. The magnetic memory device according to claim 10, wherein a spin diffusion length of the magnetization free terminal is shorter than spin diffusion lengths of the first and second magnetization pinned terminals.

15. The magnetic memory device according to claim 10, wherein
the first and second magnetization pinned terminals are made of a ferromagnetic alloy having a spin polarizability equal to or larger than that of the magnetization free terminal and having a spin diffusion length larger than 50 nm, and
the magnetization free terminal is made of a ferromagnetic alloy having a spin diffusion length smaller than 50 nm.

16. The magnetic memory device according to claim 10, wherein
the first and second magnetization pinned terminals are made of Co or a Co-base alloy, and
the magnetization free terminal is made of a NiFe alloy.

17. The magnetic memory device according to claim 10, wherein the non-magnetic region is made of Al.

18. The magnetic memory device according to claim 10, wherein
the write means reverses the magnetization direction of the magnetization free terminal with a current density of not less than $10^4$ A/cm$^2$, and
the read means detects a change in magnetic resistance with a current density of not more than $10^4$ A/cm$^2$.

* * * * *